United States Patent
Huang et al.

(10) Patent No.: US 6,765,830 B2
(45) Date of Patent: Jul. 20, 2004

(54) MEMORY DEVICE WITH SRAM INTERFACE AND DRAM CELLS

(75) Inventors: Yu-Wen Huang, Hsinchu (TW); Shu-Liang Nin, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/318,746

(22) Filed: Dec. 13, 2002

(65) Prior Publication Data

US 2003/0189857 A1 Oct. 9, 2003

(30) Foreign Application Priority Data

Apr. 8, 2002 (TW) ..................... 91107010 A

(51) Int. Cl.$^7$ ................................. G11C 7/00

(52) U.S. Cl. ...................... 365/194; 365/191

(58) Field of Search .................... 365/189.01, 191, 365/193, 194

(56) References Cited

U.S. PATENT DOCUMENTS

| | | | |
|---|---|---|---|
| 4,931,998 A | * 6/1990 | Ootani et al. | 365/230.01 |
| 5,289,413 A | * 2/1994 | Tsuchida et al. | 365/189.02 |
| 5,703,830 A | * 12/1997 | Yasuhiro | 365/233 |
| 5,777,945 A | * 7/1998 | Sim et al. | 365/230.06 |
| 5,890,186 A | * 3/1999 | Sato et al. | 711/3 |
| 5,901,109 A | * 5/1999 | Miura | 365/233 |

\* cited by examiner

*Primary Examiner*—Son Mai
(74) *Attorney, Agent, or Firm*—Quintero Law Offices

(57) ABSTRACT

A semiconductor memory device. One desired word line of a memory unit is turned on according to the row select signal, and a first delay circuit delays the column select signal a first determined time and outputs to a sense amplifier circuit. The sense amplifier circuit senses the desired word line, amplifies and outputs desired data to a latch circuit according to the column select signal. After that, the memory device can start to access the next data. Further, the delayed column select signal is also output to a second delay circuit to delay a second predetermined time as an output enable signal, and the latch circuit outputs the latched data according to the output enable signal.

12 Claims, 6 Drawing Sheets

MEMORY DEVICE WITH SRAM INTERFACE AND DRAM CELLS

BACKGROUND OF THE INVENTION

1. Field of the Invention

The present invention relates in general to a semiconductor memory device. More particularly, it relates to a semiconductor memory device with SRAM interface and DRAM cells.

2. Description of the Related Art

FIG. 1 shows a diagram of a conventional semiconductor memory device. For example, the memory cells in the conventional memory device may be one-transistor static random access memory cells (1T SRAM cells).

As shown in FIG. 1, a row decoder 1 receives a row address signal RAS from external circuit, decodes and outputs a row select signal RSS to a memory unit 3 and a delay circuit 5. The delay circuit delays the row select signal a first predetermined time as a sensing enable signal SES of sense amplifier circuit 7. One corresponding word line of the memory unit 3 is turned on according to the row select signal.

When receiving the sensing enable signal SES from the delay circuit 5, the sense amplifier circuit 7 senses the data stored in the corresponding memory cells connected to the turned on word line, amplifies and then latches the amplified data. Finally, a column decoder 9 receives a column address signal CAS from external circuit, decodes and outputs a column select signal CSS as an output enable signal of the sense amplifier circuit 7. The sense amplifier circuit 7 outputs corresponding data from the latched data to an output buffer 11 when receiving the column select signal.

In one access period, the convention memory device shown in FIG. 1, however, not only needs to wait for a sensing enable signal from the delay circuit 5 to enable the sense amplifier circuit 7 to sense and latch data but also needs to wait for column decoder 9 to decode the column address signal CAS to enable the sense amplifier circuit 7 to output a corresponding data to the output buffer 11.

SUMMARY OF THE INVENTION

Accordingly, an object of the invention is to provide a semiconductor memory device to minimize access time thereby improving whole access speed.

In the present invention, row decoder and column decoder decode the row address signal and the column address signal to output a row select signal and a column select signal respectively at the same time. One desired word line of a memory unit is turned on according to the row select signal, and a first delay circuit delays the column select signal a first determined time and outputs to a sense amplifier circuit. The sense amplifier circuit senses the desired word line, amplifies and outputs a desired data to a latch circuit according to the column select signal. After that, the memory device can start to access the next data. Further, the delayed column select signal is also output to a second delay circuit to delay a second predetermined time as a output enable signal, and the latch circuit outputs the latched data according to the output enable signal.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 2:
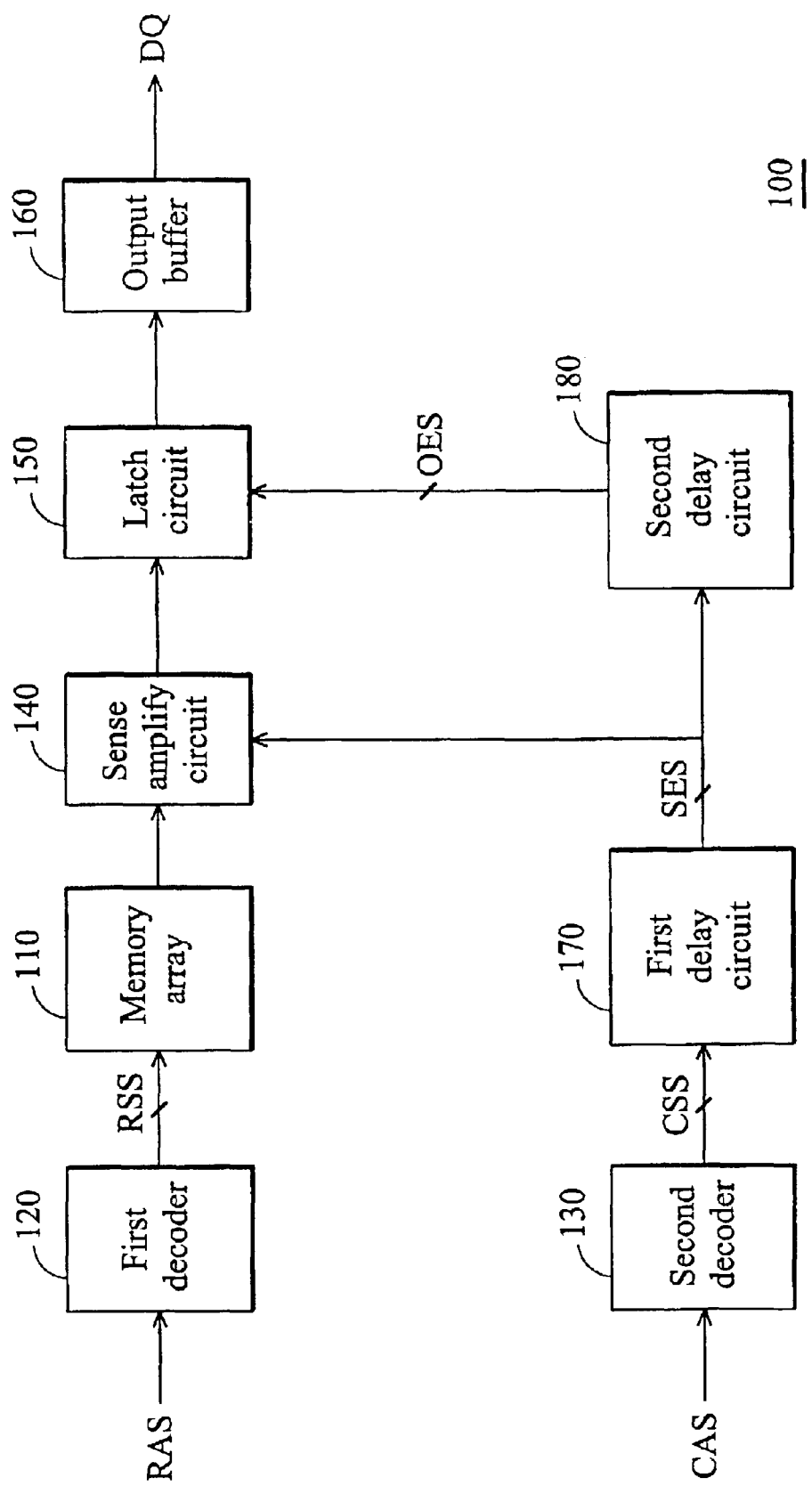
FIG. 2 shows the structure of the semiconductor memory device according to the present invention.

FIG. 2 shows the structure of the semiconductor memory device according to the present invention. As shown in FIG. 2, the semiconductor memory device 100 of the present invention has a memory array 110, a first decoder 120, a second decoder 130, a sense amplifier circuit 140, a latch circuit 150, an output buffer 160, a first delay circuit 170, and a second delay circuit 180. The first decoder 120 and the second decoder 130 are a row address decoder and a column address decoder respectively, wherein the external circuit outputs address signal composed of row address signal and column address signal to the first decoder 120 and the second decoder 130. The first decoder 120 receives a row address signal RAS from an external circuit, and decodes into a row select signal RSS to output to the memory array 110. The second decoder 130 receives a column address signal CAS from an external circuit, and decodes into a column select signal CSS to output to the first delay circuit 170.

Figure 3:
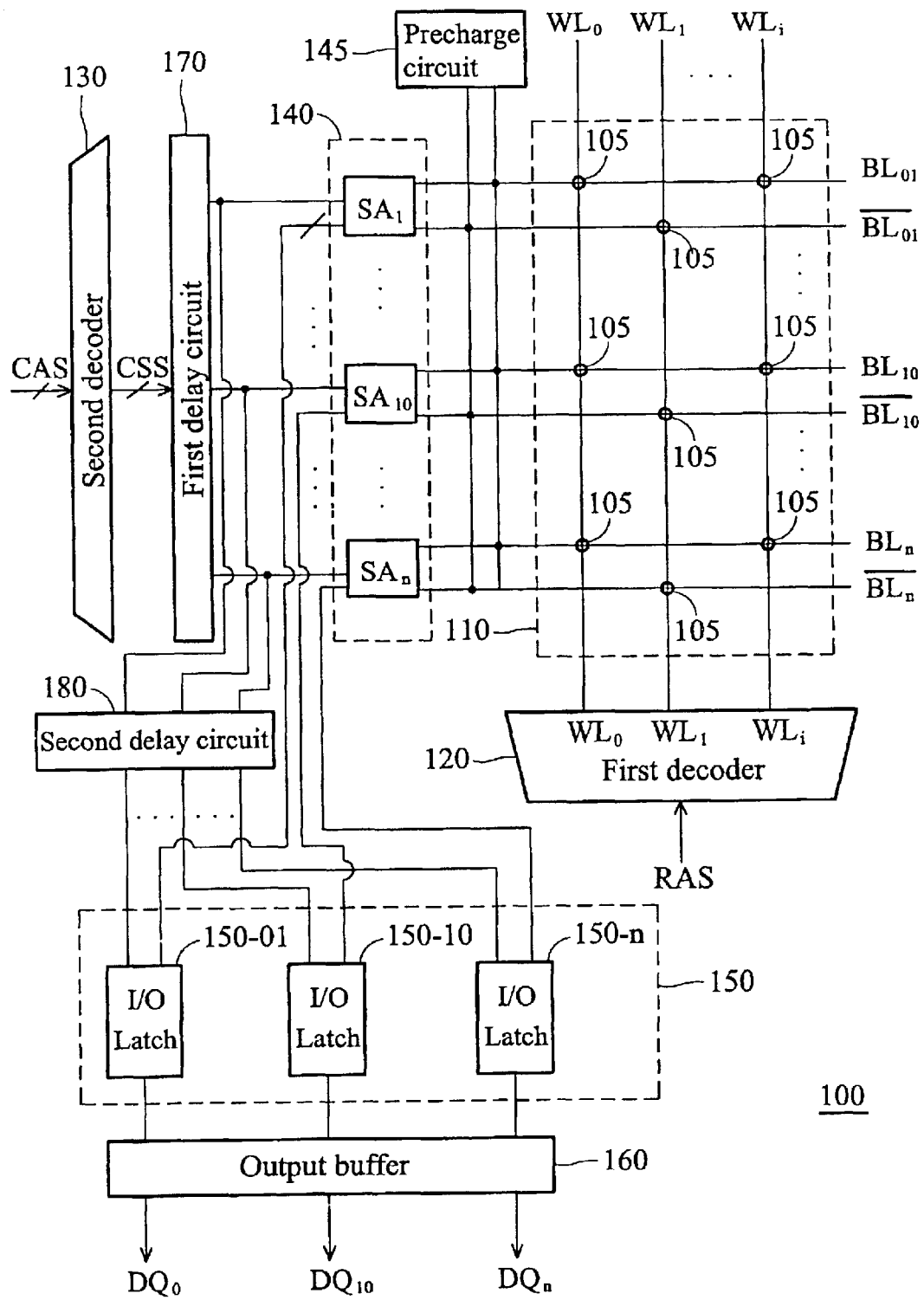
FIG. 3 is another diagram of the semiconductor memory device of the present invention.

The memory array 110 is coupled to the first decoder 120, and has a plurality of DRAM cells 105, a plurality of word lines $WL_0$~$WL_i$ and a plurality of bit line pairs $BL_{00}$~$BL_{mm}$, wherein the word lines $WL_0$~$WL_i$ and the bit line pairs $BL_{00}$~$BL_{mm}$, are crisscrossed, and each memory cell 105 is disposed between one of the word lines $WL_0$~$WL_i$ and one of the bit line pairs $BL_{00}$~$BL_{mm}$ or /$BL_{00}$~/$BL_{mm}$, as shown in FIG. 3. Each memory cell 105 is composed of a transistor and a capacitor, the gate terminal of the transistor is connected to one word line, the drain terminal of the transistor is connected to one bit line, and the source terminal of the transistor is connected to the top electrode of the corresponding capacitor. Bottom electrodes of all capacitors of the memory cells are connected to a reference voltage together (not shown). For example, the reference voltage is half of the sense amplifier power source.

One desired word line is turned on when the memory array 110 receives the row select signal RAS from the first decode 120. For example, a desired bit line is applied to a predetermined voltage indicating the logic state of a desired data when a corresponding word line is turned on, such that the capacitor coupled to the desired bit line is charged or discharge to indicate the logic state of the desired data. Therefore, a desired data is programmed into the memory cell. The bit line pairs are precharged to the reference voltage before reading out the data stored in the memory calls. The desired word line is then turned on, such that the bit lines share charge with the capacitors connected to the desired word line. The data stored in the capacitor is logic one when the potential of the bit line is increased after the share charge. On the contrary, the data stored in the capacitor is logic zero when the potential of the bit line is decreased after the share charge.

The first delay circuit 170 is coupled to the second decoder 130 to delay the column select signal CSS a first determined time, and to output to the sense amplifier circuit as a sensing enable signal SES, wherein the sensing enable signal SES is output after a desired bit line and a memory cell has shared charge. That is to say, the first determined time is longer than the share charge between the bit line and a memory cell.

The sense amplifier circuit 140 is coupled to the memory and the first delay circuit 170, the sense amplifier circuit 140 senses a desired bit line pair connected to a turned on word line, amplifies and outputs a desired data according to the sense enable signal SES.

The second delay circuit 180 is coupled between the first delay circuit 170 and the latch circuit 150, the second delay circuit delays the column select signal CSS a second determined time as an output enable signal after receiving the column select signal CSS.

The latch circuit 150 is coupled to the sense amplifier circuit to latch the desired data from the sense amplifier circuit, and to output the desired data to the output buffer 160 when receiving an output enable signal OES. The output buffer 160 is coupled to the latch circuit 150 to buffer the desired data from the latch circuit 150, and to output to the external circuit, for example data bus.

Figure 4:
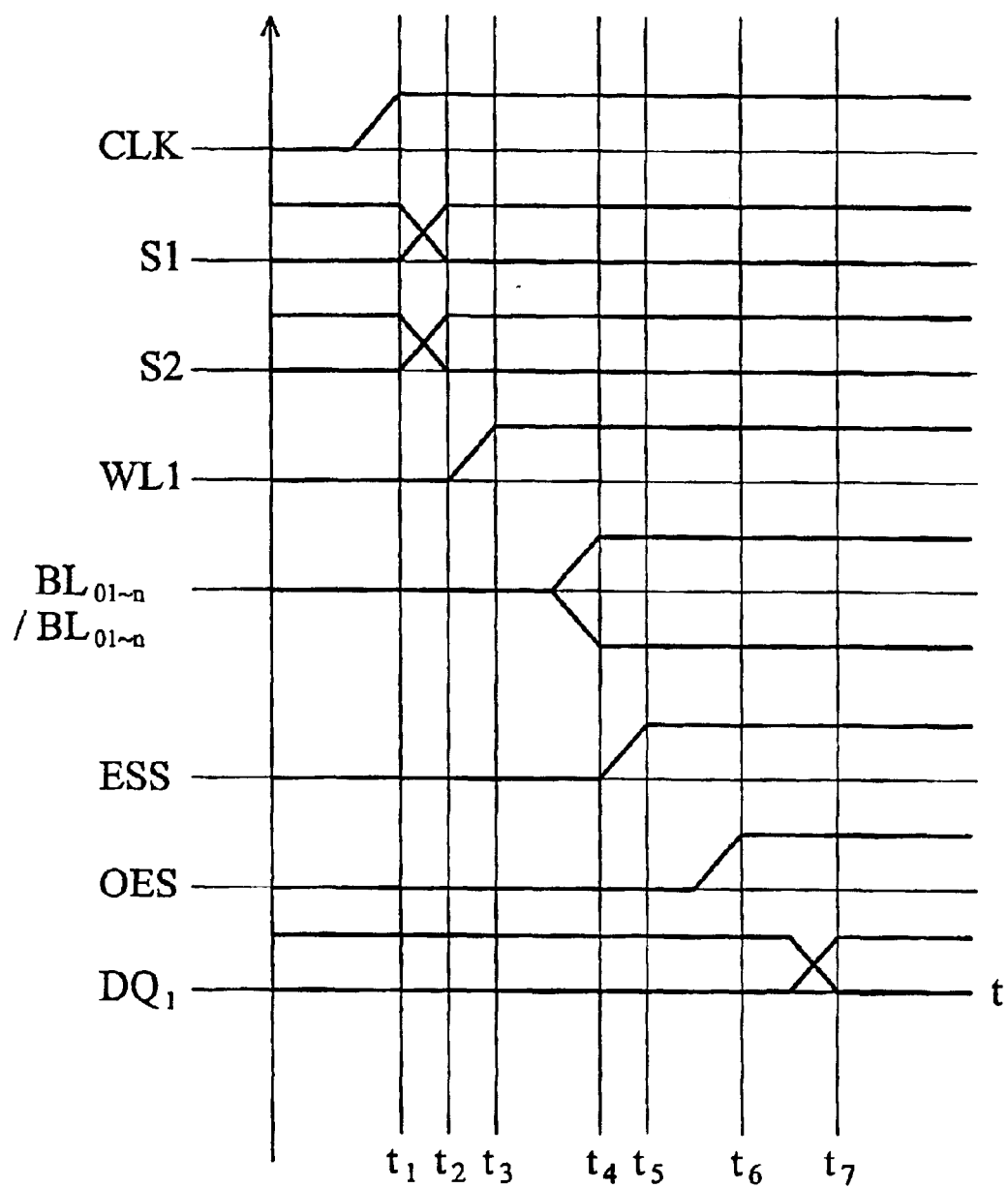
FIG. 4 is time chart of the memory device of the present invention.

FIG. 3 is another diagram of the semiconductor memory device of the present invention, and FIG. 4 is a time chart of the memory device of the present invention.

The data accessing operation of the memory device according to the present invention is disclosed below by referring to FIG. 3 and FIG. 4. The precharge circuit charges the bit line pairs $BL_{00}$~$BM_{mm}$ of the memory array 120 to the reference voltage before reading out a data, for example time t1.

At time t1, the precharge circuit 145 stops charging the bit line pair $BL_{00}$~$BL_{mm}$ of the memory array 120 when receiving a control signal CLK from an external circuit.

At time t2, the row address decoder 120 and the column address decoder 130 receive a row address signal RAS and a column address signal CAS from an external circuit respectively. The row address decoder 120 decodes the row address signal RAS and outputs a row select signal RSS to the memory array 110. The column address decoder 130 decodes the column address signal CAS and outputs a column select signal CSS to the first delay circuit 170. The first delay circuit 170 delays the column select signal CSS a first predetermined time as a sense enable signal SES to output to the sense amplifier circuit 140 and the second delay circuit 180. The second delay circuit 180 delays the sense enable signal SES a second predetermined time as an output enable signal OES to output to the latch circuit 150.

At time t3, one desired word line, for example word line BL00, of the memory array 110 is turned on according to the row select signal RSS, such that all capacitors of the memory cells 105 connected to the desired word line BL00 share charge with the corresponding bit line pair thereof. At this time, the capacitors may charge the corresponding bit lines when the stored data is logic one, such that the potential of the charged bit lines is increased. On the contrary, the capacitors may be charged by the corresponding bit lines when the stored data is logic zero, such that the potential of the charged bit lines is decreased.

At time t4, different potential corresponding to the logic stored in the capacitors of the memory cells 105 are created between two bit lines of each bit line pair.

At time t5, one selected sense amplifier, for example SA1, of the sense amplifier circuit 140 senses the corresponding bit pair according to the sense enable signal SES from the first delay circuit 170, and then amplifies the sensed data and outputs to the latch circuit 150, for example I/O latch 150-01.

At time t6, the I/O latches $150_{-01}$~$150_{-n}$ of the latch circuit 150 output the latched data to the output buffer 160 when receiving the output enable signal OES.

At time t7, the output buffer 160 outputs the buffer data to external circuit, for example data bus, when receiving an output control signal from the other external circuit.

Figure 5A:
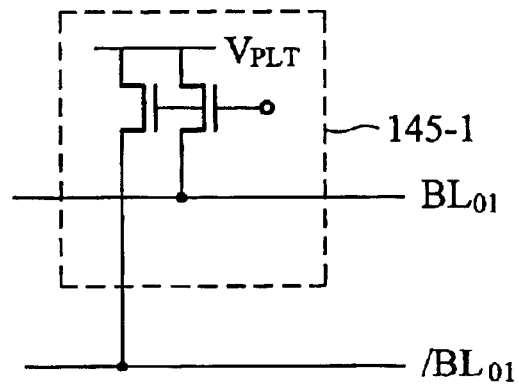
FIG. 5a shows a charge circuit structure 145-1 of the precharge circuit.

FIG. 5a shows a charge circuit structure 145-1 of the precharge circuit. In the present invention, the precharge circuit 145 is composed of a plurality of the charge circuit structure $145_{-1}$~$145_{-n}$. As shown in FIG. 5a, the charge circuit 154-1 has two N-type transistors, gate terminals of the two transistors are coupled to an external control circuit to enable precharge or disable precharge, drain terminals of the two transistors are coupled to the reference voltage VPLT, for example half of the power source, and source terminals of the two transistor are coupled to the bit line $BL_{01}$ and the bit line/$BL_{01}$ respectively.

Figure 5B:
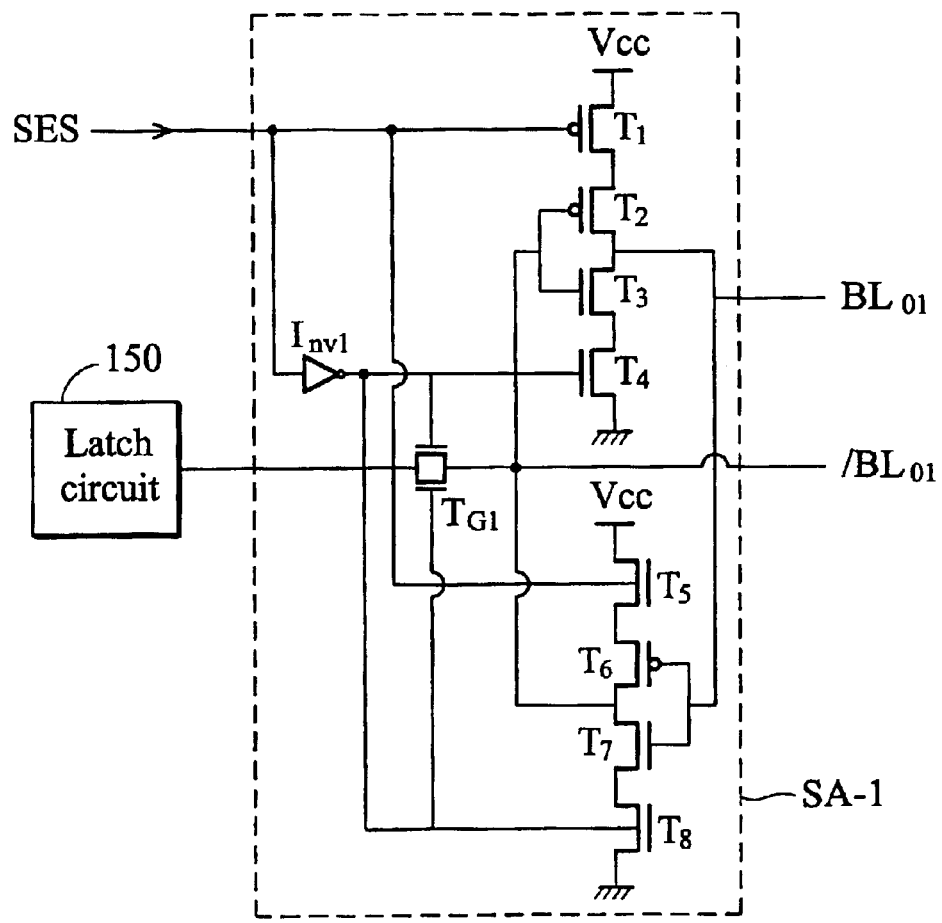
FIG. 5b shows circuit structure of the sense amplifier SA-1 shown in FIG. 3.

FIG. 5b shows circuit structure of the sense amplifier SA-1 shown in FIG. 3. In the present invention, the sense amplifier circuit 140 is composed of a plurality of sense amplifiers $SA_1$~$SA_n$. As shown in FIG. 5b, the sense amplifier $SA_1$ is composed transistors $T_1$~$T_8$, a transmitting gate TG1 and an inverter INV1. For example, the sense amplifier $SA_1$ senses the potential between the bit lines BL and /BL and then amplifies the sensed data and outputs to the I/O latch $150_{-01}$ after receiving the sense enable signal SES from the first delay circuit 170.

Figure 5C:
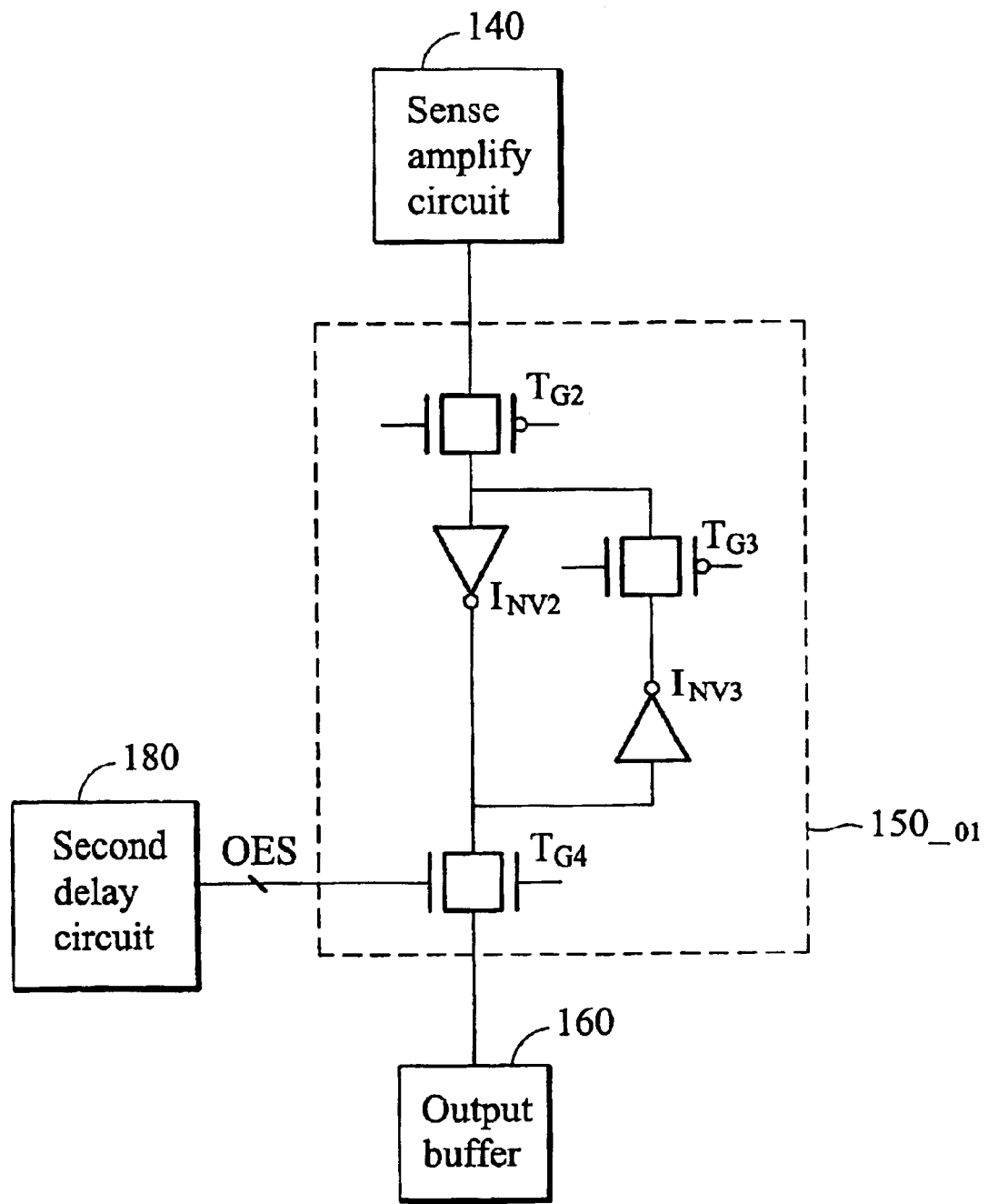
FIG. 5c shows the circuit structure of the I/O latch 150-01 shown in FIG. 3

FIG. 5c shows the circuit structure of the I/O latch $150_{-01}$ shown in FIG. 3. In the present invention, the latch circuit 150 is composed of a plurality of I/O latches $150_{-01}$~$150_{-n}$. As shown in FIG. 5c, the I/O latch 150-01 is composed of three transmitting gates TG2~TG4, and two inverters INV2~INV3. One terminal of the transmitting gate TG2 is coupled to the sense amplifier SA1 for receiving the output data and then latches the received data, the I/O latch $150_{-01}$ outputs the latched data when receiving the output enable signal OES from the second delay circuit 180.

Figure 1:
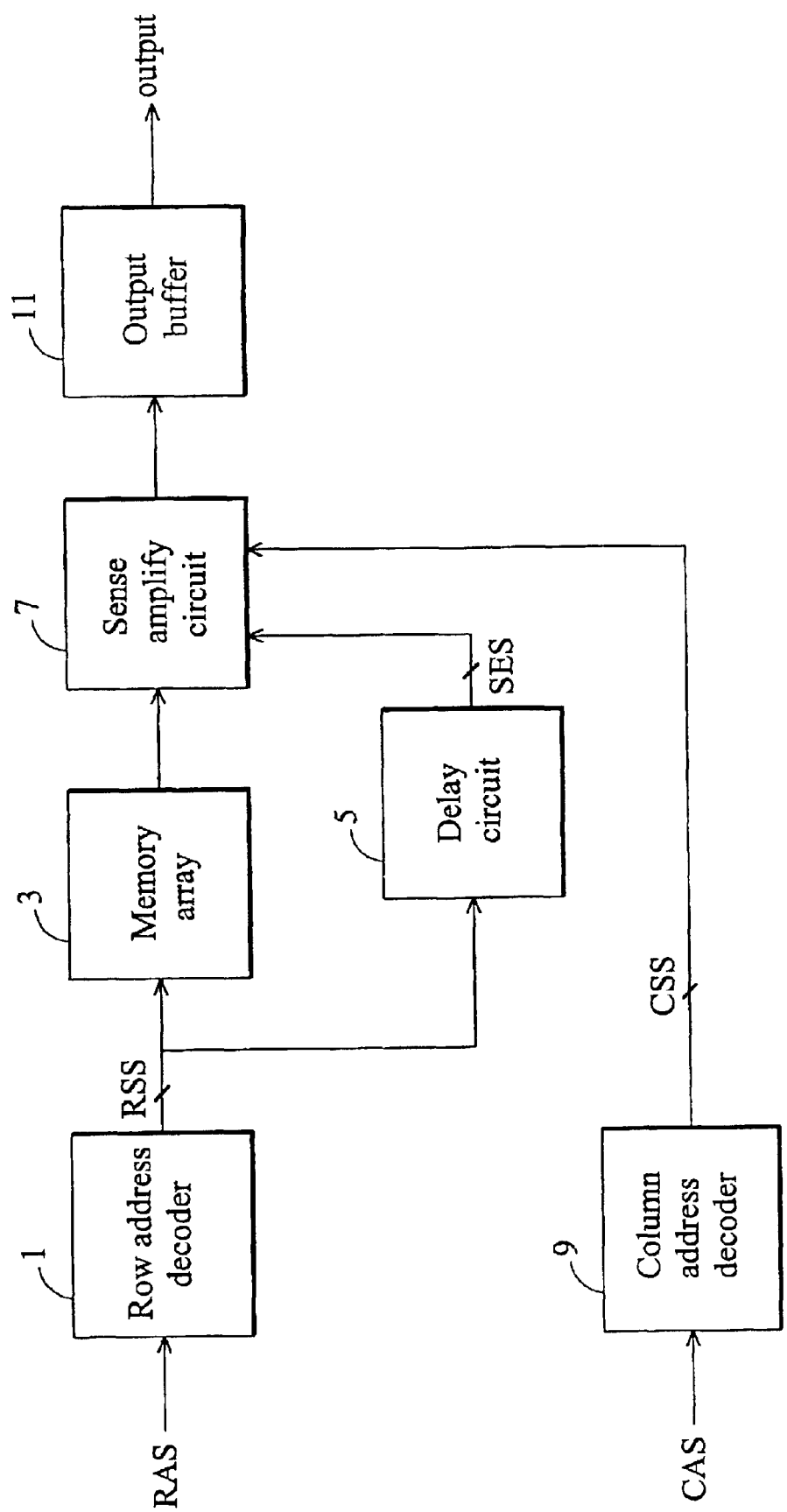
FIG. 1 shows a diagram of a conventional semiconductor memory device.

In the present invention, the row address decoder and the column address decoder decode the row address signal and the column address signal respectively at the same time, and the sense amplifier circuit senses, then amplifies the sensed data and outputs the sensed data according only to the sense enable signal. After that, the next data can be accessed. Namely, the present does not need to wait for the column address decoder to decode the column address signal to enable the sense amplifier circuit to output after the desired data has been sensed by the sense amplifier circuit. Therefore, the present invention is quicker than the conventional memory device as shown in FIG. 1, minimizing access time and improving whole access speed.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A semiconductor memory device, comprising:
a memory array having a plurality of dynamic memory cells,
a plurality of word lines and a plurality of bit line pairs, wherein the word lines and the bit line pairs are crisscrossed, and each memory cell is disposed between one of the word lines and one of the bit line pairs;
a first decoder coupled to the word lines of the memory array, decoding a first address signal and outputting a first select signal to turn on a desired word line of the memory array;
a sense amplifier circuit coupled to the bit line pairs of the memory array;
a second decoder for decoding a second address signal, and outputting a second select signal;
a first delay circuit coupled to the second decoder, delaying the second select signal a first determined time and outputting a sensing enable signal to the sense amplifier circuit, wherein the sense amplifier circuit senses a desired bit line pair connected to the desired word line, amplifies and outputs desired data according to the sensing enable signal;
a second delay circuit coupled to the first delay circuit and the sense amplifier circuit, delaying the second select signal a second determined time as an output enable signal after receiving the second select signal; and
a latch circuit coupled to the sense amplifier circuit, latching the desired data output from the sense amplifier circuit, and outputting the desired data when receiving the output enable signal.

2. The semiconductor memory device as claimed in claim 1, further comprising:
a precharge circuit coupled to the memory array for precharging the bit line pairs of the memory array; and
an output buffer coupled to the latch circuit for buffering the desired data output from the latch circuit.

3. The semiconductor memory device as claimed in claim 1, wherein the first decoder is a row decoder.

4. The semiconductor memory device as claimed in claim 1, wherein the second decoder is a column decoder.

5. The semiconductor memory device as claimed in claim 4, wherein each memory cell is a 1T SRAM composed of a transistor and a capacitor.

6. The semiconductor memory device as claimed in claim 1, wherein the first determined time is longer than the share charge between the bit line pairs and the memory cells connected to the desired word has turned on.

7. A semiconductor memory device, comprising:
a memory array having a plurality of dynamic memory cells,
a plurality of word lines and a plurality of bit line pairs, wherein the word lines and the bit line pairs are crisscrossed, and each memory cell is disposed between one of the word lines and one of the bit line pairs;
a row address decoder coupled to the word lines of the memory array, decoding a row address signal and outputting a row select signal to turn on a desired word line of the memory array;
a sense amplifier circuit coupled to the bit line pairs of the memory array;
a column address decoder for decoding a column address signal, and outputting a column select signal;
a first delay circuit coupled to the column address decoder, delaying the column select signal a first determined time and outputting a sensing enable signal to the sense amplifier circuit; wherein the sense amplifier circuit senses a desired bit line pair connected to the desired word line, and amplifies and outputs a desired data according to the sensing enable signal;
a second delay circuit coupled to the first delay circuit and the sense amplifier circuit, delaying the column select signal a second determined time as an output enable signal after receiving the column select signal;
a latch circuit coupled to the sense amplifier circuit, latching the desired data output from the sense amplifier circuit, and outputting the desired data when receiving the output enable signal;
an output buffer coupled to the latch circuit for buffering the desired data output from the latch circuit; and
a precharge circuit coupled to the memory array for precharging the bit line pairs of the memory array.

8. A semiconductor memory device, comprising:
a memory array having a plurality of dynamic memory cells,
a plurality of word lines and a plurality of bit line pairs, wherein the word lines and the bit line pairs are crisscrossed, and each memory cell is disposed between one of the word lines and one of the bit line pairs;
a first decoder coupled to the word lines of the memory array, decoding a first address signal and outputting a first select signal to turn on a desired word line of the memory array;
a sense amplifier circuit coupled to the bit line pairs of the memory array;
a second decoder for decoding a second address signal, and outputting a second select signal;
a first delay circuit coupled to the second decoder, delaying the second select signal a first determined time and outputting a sensing enable signal to the sense amplifier circuit, wherein the sense amplifier circuit senses a desired bit line pair connected to the desired word line, amplifies and outputs desired data according to the sensing enable signal, and the first determined time is longer than the share charge between the bit line pairs and the memory cells connected to the desired word has turned on.

9. The semiconductor memory device as claimed in claim 8, further comprising:
a precharge circuit coupled to the memory array for precharging the bit line pairs of the memory array; and
an output buffer coupled to the latch circuit for buffering the desired data output from the latch circuit.

10. The semiconductor memory device as claimed in claim 8, wherein the first decoder is a row decoder.

11. The semiconductor memory device as claimed in claim 8, wherein the second decoder is a column decoder.

12. The semiconductor memory device as claimed in claim 11, wherein each memory coil is a 1T SRAM composed of a transistor and a capacitor.

* * * * *